US012588235B2

(12) United States Patent
Yu et al.

(10) Patent No.: US 12,588,235 B2
(45) Date of Patent: Mar. 24, 2026

(54) SEMICONDUCTOR STRUCTURE AND MANUFACTURING METHOD OF THE SAME

(71) Applicant: Vanguard International Semiconductor Corporation, Hsinchu (TW)

(72) Inventors: Hsiu-Mei Yu, Hsinchu City (TW); Guang-Yuan Jiang, Hsinchu City (TW); Cheng-Yi Hsieh, Jhubei City (TW); Wei-Chan Chang, Taoyuan City (TW); Chang-Sheng Lin, Jhunan Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 458 days.

(21) Appl. No.: 17/586,244

(22) Filed: Jan. 27, 2022

(65) Prior Publication Data

US 2023/0238308 A1     Jul. 27, 2023

(51) Int. Cl.
H10D 30/47          (2025.01)
H10P 95/00          (2026.01)
(Continued)

(52) U.S. Cl.
CPC ......... H10D 30/471 (2025.01); H10P 95/112 (2026.01); H10W 20/023 (2026.01); H10W 20/20 (2026.01); H10W 70/40 (2026.01)

(58) Field of Classification Search
CPC ......... H01L 29/66431; H01L 29/66462; H01L 29/772; H01L 29/778; H01L 29/7781;
(Continued)

(56) References Cited

U.S. PATENT DOCUMENTS 9,006,791 B2 *   4/2015   Kub ...................... H01L 27/095
                                              257/E29.253
11,810,971 B2 *  11/2023  Wu ................... H01L 23/49562
                          (Continued)

FOREIGN PATENT DOCUMENTS

TW          201418470 A     5/2014
TW          202139374 A     10/2021

OTHER PUBLICATIONS

Taiwanese Office Action and Search Report for Taiwanese Application No. 110147391, dated Dec. 19, 2022.

*Primary Examiner* — Eduardo A Rodela
(74) *Attorney, Agent, or Firm* — Birch, Stewart, Kolasch & Birch, LLP

(57)          ABSTRACT

A semiconductor structure is provided. The semiconductor structure includes a lead frame and a sub-substrate disposed on the lead frame, wherein the thickness of the sub-substrate is between 0 and 0.5 μm. The semiconductor structure also includes an epitaxial layer disposed on the sub-substrate. The epitaxial layer includes a buffer layer, a channel layer and a barrier layer. The buffer layer is disposed between the sub-substrate and the channel layer. The channel layer is disposed between the buffer layer and the barrier layer. The semiconductor structure further includes a device layer disposed on the barrier layer and an interconnector structure electrically connected to the epitaxial layer and/or the device layer by a through hole.

18 Claims, 5 Drawing Sheets

(51) Int. Cl.
| | |
|---|---|
| *H10W 20/00* | (2026.01) |
| *H10W 20/20* | (2026.01) |
| *H10W 70/40* | (2026.01) |

(58) Field of Classification Search
CPC ............. H01L 29/7782; H01L 29/7786; H01L 29/7783; H01L 23/495; H01L 21/76898; H01L 21/7813; H10D 30/015; H10D 30/40; H10D 30/47; H10D 30/471; H10D 30/472; H10D 30/473; H10D 30/4732; H10D 30/474; H10D 30/475; H10D 30/476; H10D 30/481; H10D 30/501; H10D 30/502; H10D 30/503; H10D 30/504; H10D 30/506; H10D 30/507; H10D 30/508; H10D 30/509; H10D 64/665; H10D 20/023; H10P 95/112
See application file for complete search history.

(56) References Cited

U.S. PATENT DOCUMENTS

| | | | |
|---|---|---|---|
| 11,817,482 B2 * | 11/2023 | Brech ................... | H01L 29/778 |
| 2021/0375856 A1 | 12/2021 | Alcom et al. | |
| 2022/0181236 A1 * | 6/2022 | Okamoto ............. | H01L 23/481 |
| 2023/0207675 A1 * | 6/2023 | Grote ............... | H01L 29/66462 |
| | | | 257/76 |

* cited by examiner

SEMICONDUCTOR STRUCTURE AND MANUFACTURING METHOD OF THE SAME

BACKGROUND

Technical Field

The present disclosure relates to a semiconductor structure and a manufacturing method of the same, and in particular to a method for recycling a substrate and the semiconductor structure using the method.

Description of the Related Art

GaN-based semiconductor materials have many excellent material properties, such as high heat-resistance, wide bandgap, and high electron saturation rate. Therefore, GaN-based semiconductor materials are suitable for high-speed and high-temperature operating environments. In recent years, GaN-based semiconductor materials have been widely used in light-emitting diode (LED) devices and high-frequency devices, such as high electron mobility transistors (HEMTs) with heterogeneous interface structures.

Moreover, with the development of GaN-based semiconductor materials, semiconductor structures with the GaN-based semiconductor materials are used in more extreme working environments, such as high frequency, high temperature, or high voltage. However, in the process of manufacturing the semiconductor structures (e.g., a backend process), some challenges may be faced. For example, grinding the substrate to thin the substrate is wasteful (i.e., the substrate cannot be reused), and/or the semiconductor structure including the substrate is difficult to dicing or backside grinding (BG), etc.

Therefore, the semiconductor structures with GaN-based semiconductor materials require further improvements to overcome the faced challenges.

SUMMARY

Some embodiments of the present disclosure include a semiconductor structure. The semiconductor structure includes a lead frame and a sub-substrate disposed on the lead frame, wherein the thickness of the sub-substrate is between 0 and 0.5 μm. The semiconductor structure also includes an epitaxial layer disposed on the sub-substrate. The epitaxial layer includes a buffer layer, a channel layer and a barrier layer. The buffer layer is disposed between the sub-substrate and the channel layer. The channel layer is disposed between the buffer layer and the barrier layer. The semiconductor structure further includes a device layer disposed on the barrier layer and an interconnector structure electrically connected to the epitaxial layer and/or the device layer by a through hole.

Some embodiments of the present disclosure include a manufacturing method of a semiconductor structure. The manufacturing method of the semiconductor structure includes the following steps. A substrate is provided. An epitaxial layer is formed on the substrate. A device layer is formed on the epitaxial layer to form a stacked structure. A carrier substrate is provided, wherein the device layer is between the carrier substrate and the substrate. At least a portion of the substrate is removed. At least one through hole is formed in the stacked structure. At least one interconnector structure is formed to cover the through hole, wherein the interconnector structure is electrically connected to the epitaxial layer or the device layer. The stacked structure and the interconnector structure are transferred from the carrier substrate to a lead frame.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
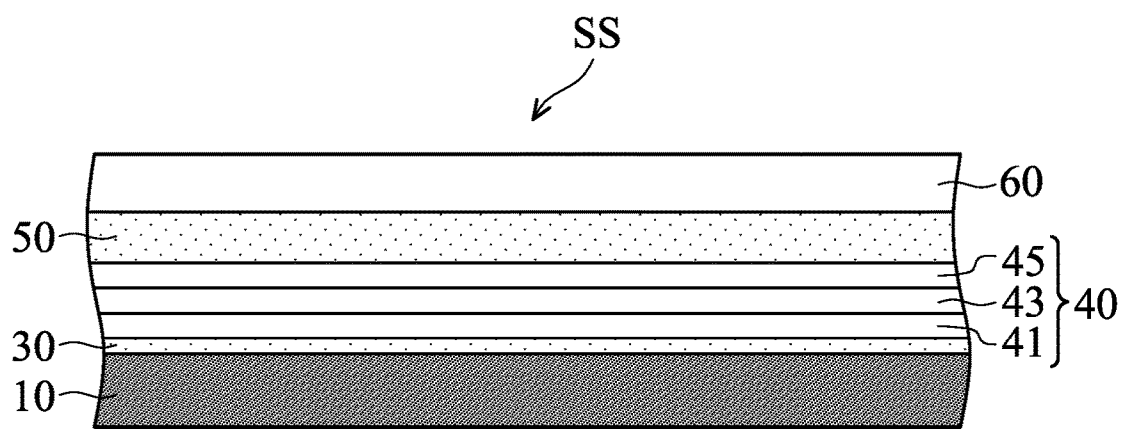
FIG. 1 to FIG. 3 and FIG. 4A to FIG. 4D are cross-sectional views illustrating different stages of manufacturing the semiconductor structure according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and other similar terms, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about,"

"approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

According to some embodiments of the present disclosure, a manufacturing method of a semiconductor structure is provided. Through the manufacturing method of the semiconductor structure according to some embodiments of the present disclosure, the substrate may be recycled and reused to reduce the overall manufacturing cost. Moreover, it may also reduce the difficulty and cost of dicing or backside grinding (BG), and allow the formation of, for example, through silicon vias (TSV) or redistribution layers (RDL).

FIG. 1 to FIG. 3 and FIG. 4A to FIG. 4D are cross-sectional views illustrating different stages of manufacturing the semiconductor structure 100 according to some embodiments of the present disclosure. It should be noted that some components of the semiconductor structure 100 have been omitted in FIG. 1 to FIG. 3 and FIG. 4A to FIG. 4D in order to show the technical features of the embodiments of the present disclosure more clearly.

Referring to FIG. 1, in some embodiments, a substrate 10 is provided. The substrate 10 may include a ceramic substrate or a silicon-containing substrate. In some embodiments, the substrate 10 may be a semiconductor-on-insulator substrate (SOI) substrate. In some embodiments, the substrate 10 includes a core and a dielectric layer (not shown in detail in FIG. 1). The dielectric layer is disposed on the core and/or encapsulates the core, and the dielectric layer may be multiple layers. For example, the dielectric layer may be disposed on one surface of the core. Alternatively, the dielectric layer may be disposed on each surface of the substrate 10 (i.e., the dielectric layer may encapsulate the core).

The core may include ceramic material, such as aluminum nitride (AlN), gallium nitride (GaN), aluminum gallium nitride (AlGaN), silicon carbide (SiC), zinc oxide (ZnO), gallium(III) trioxide ($Ga_2O_3$), any other suitable material or a combination thereof, but the present disclosure is not limited thereto. The ceramic material may include a bonding material, such as yttrium oxide (i.e., yttria).

The dielectric layer may include any suitable dielectric material, such as silicon oxide ($SiO_2$), silicon nitride (SiN), silicon carbonitride, silicon oxynitride, silicon carbide, low-κ dielectric materials, aluminum oxide, aluminum nitride, any other similar material, or a combination thereof, but the present disclosure is not limited thereto.

The substrate 10 may further include a conductive layer. The conductive layer may include a highly conductive material that is doped (e.g., doped with boron). For example, the doping concentration may be between $1\times10^{19}$ $cm^{-3}$ and $1\times10^{20}$ $cm^{-3}$ to provide high conductivity. Other dopants with different doping concentrations (e.g., phosphorus, arsenic, bismuth, etc. with doping concentration between $1\times10^{16}$ $cm^{-3}$ and $5\times10^{18}$ $cm^{-3}$) may also be used to provide N-type or P-type semiconductor materials suitable for use in the conductive layer, but the present disclosure is not limited thereto.

Referring to FIG. 1, in some embodiments, a semiconductor layer 30 is formed on the substrate 10. For example, the semiconductor layer 30 may include silicon (Si), germanium (Ge), aluminum nitride (AlN), gallium nitride (GaN), aluminum gallium nitride (AlGaN), silicon carbide (SiC), any other suitable material, or a combination thereof, but the present disclosure is not limited thereto. The semiconductor layer 30 may be a single-layer or multi-layer structure. The semiconductor layer 30 may be formed by an epitaxial growth process, such as metal organic chemical vapor deposition (MOCVD), hydride vapor phase epitaxy (HVPE), molecular beam epitaxy (MBE), any other suitable process, or a combination thereof, but the present disclosure is not limited thereto.

Referring to FIG. 1, in some embodiments, an epitaxial layer 40 is formed on the substrate 10. Specifically, the epitaxial layer 40 is formed on the semiconductor layer 30. For example, the epitaxial layer 40 may include III-V compound semiconductor materials, such as gallium nitride (GaN), aluminum nitride (AlN), aluminum gallium nitride (AlGaN), indium aluminum nitride (InAlN), any other similar material, or a combination thereof. In some embodiments, the epitaxial layer 40 includes a buffer layer 41, a channel layer 43, and a barrier layer 45, the buffer layer 41 is disposed between the substrate 10 and the channel layer 43, and the channel layer 43 is disposed between the buffer layer 41 and the barrier layer 45. For example, the buffer layer 41, the channel layer 43, and the barrier layer 45 may be sequentially formed on the substrate by an epitaxial growth process, such as chemical vapor deposition (CVD), atomic layer deposition (ALD), molecular beam epitaxy (MBE), liquid phase epitaxy (LPE), any other similar process, or a combination thereof, but the present disclosure is not limited thereto.

Referring to FIG. 1, in some embodiments, a device layer 50 is formed on the epitaxial layer 40. For example, the device layer 50 may include one or more III-V compound semiconductor materials, such as p-type gallium nitride (p-GaN), any other similar material, or a combination thereof. In some embodiments, the device layer 50 includes conductive structures, such as a source structure, a drain structure, and a gate structure. However, the detailed structure of the device layer 50 is not shown in FIG. 1. Furthermore, the device layer 50 may also include any suitable dielectric material. Examples of dielectric material are described above and will not be repeated here. The device layer 50 may be formed on the epitaxial layer 40 by a deposition process, such as chemical vapor deposition (CVD), atomic layer deposition (ALD), molecular beam epitaxy (MBE), liquid phase epitaxy (LPE), any other similar process, or a combination thereof, but the present disclosure is not limited thereto.

As shown in FIG. 1, in some embodiments, a passivation layer 60 is formed on the device layer 50. For example, the passivation layer 60 may include polyimide (PI) or other suitable insulating materials. The passivation layer 60 may be formed on the device layer 50 by spin coating, chemical vapor deposition (CVD), physical vapor deposition (PVD), atomic layer deposition (ALD), high density plasma CVD (HDPCVD), any other suitable method, or a combination thereof, but the present disclosure is not limited thereto. In some other embodiments, the semiconductor structure 100 may not include the passivation layer 60.

As shown in FIG. 1, in some embodiments, the substrate 10, the semiconductor layer 30, the epitaxial layer 40 (that includes the buffer layer 41, the channel layer 43, and the barrier layer 45), the device layer 50, and the passivation layer 60 (the passivation layer 60 is not included in some other embodiments) may be regarded as a stacked structure SS.

Figure 2:
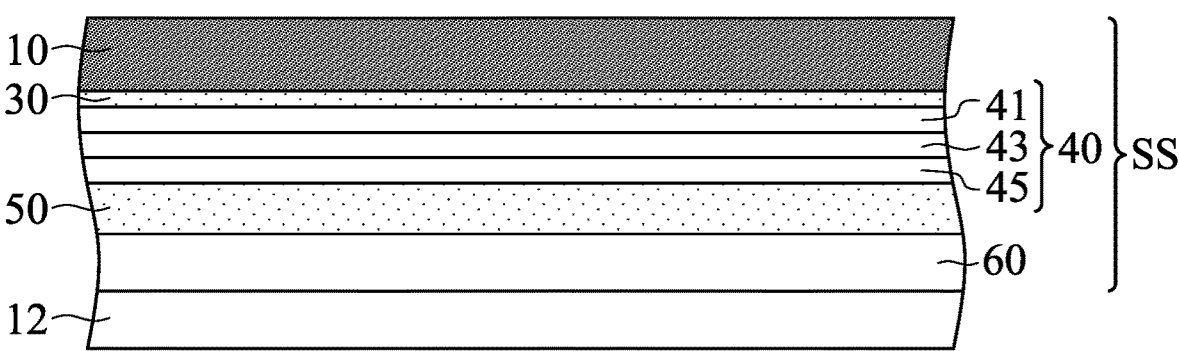

Referring to FIG. 2, in some embodiments, a carrier substrate 12 is provide, so that the device layer 50 is between the carrier substrate 12 and the substrate 10. Specifically, the passivation layer 60 may be connected to the carrier substrate 12 to bond the stacked structure SS on the carrier substrate 12, but the present disclosure is not limited thereto. For example, the carrier substrate 12 may include glass, ceramic, sapphire substrate, any other suitable material, or a combination thereof, but the present disclosure is not limited thereto. As shown in FIG. 2, in some embodiments, the stacked structure SS is turned upside down to be bonded to the carrier substrate 12, so that the device layer 50 (and the passivation layer 60) is between the carrier substrate 12 and the epitaxial layer 40.

Figure 3:
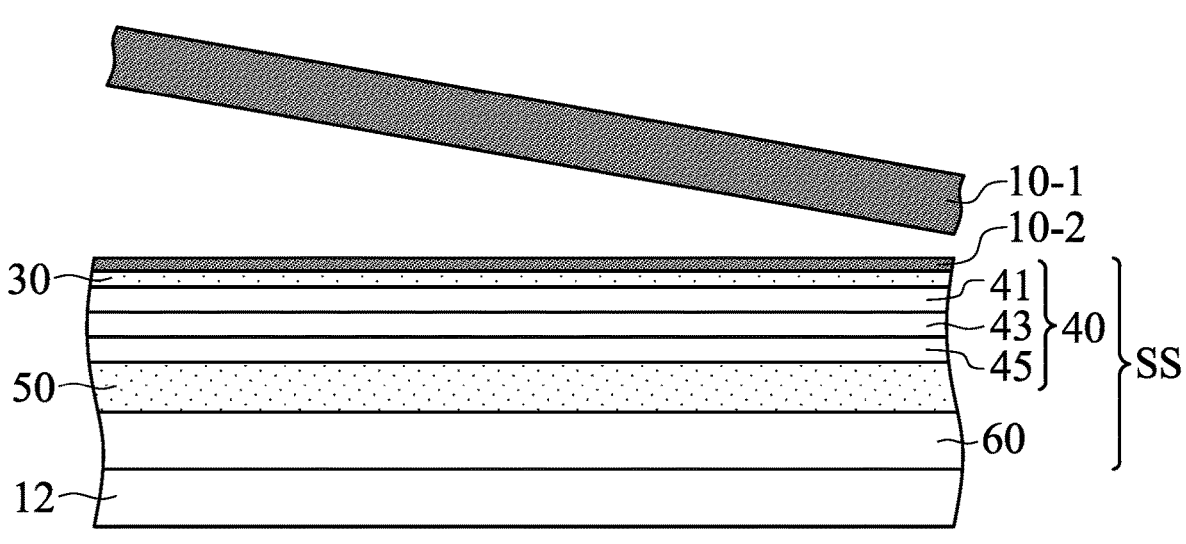

Referring to FIG. 3, in some embodiments, at least a portion of the substrate 10 is taken off to remove at least a portion of the substrate 10 from the stacked structure SS. For example, at least a portion of the substrate 10 may be removed from the stacked structure SS by chemical etching (e.g., wet etching performed using hydrofluoric acid (HF), ammonium hydroxide ($NH_4OH$) or any suitable etchant), smart cut, laser trimming, or any suitable method, but the present disclosure is not limited thereto.

As shown in FIG. 3, in some embodiments, most of the substrate 10 (i.e., the main substrate 10-1 in FIG. 3) is removed from the stacked structure SS, while another part of the substrate 10 (i.e., the sub-substrate 10-2 in FIG. 3) remains in the stacked structure SS. In some other embodiments, the substrate 10 may be completely removed from the stacked structure SS. That is, the sub-substrate 10-2 may also be completely removed from the stacked structure SS. In some embodiments, the thickness of the sub-substrate is between about 0 and 0.5 micrometers ($\mu m$). Moreover, the material of the main substrate 10-1 may be completely or partially the same as the material of the sub-substrate 10-2.

Figure 4A:
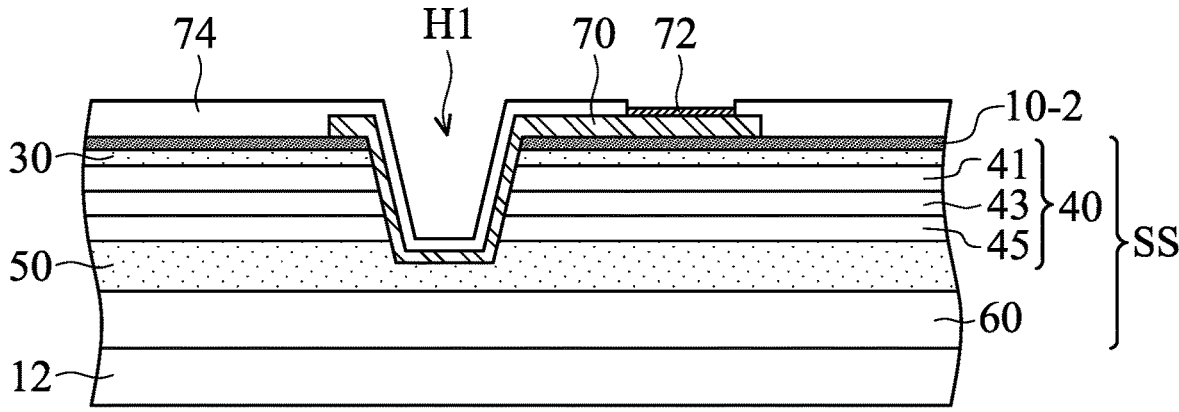

Referring to FIG. 4A, in some embodiments, multiple through holes H1 are formed in the stacked structure SS (only one through hole H1 is shown in FIG. 4A). In the embodiment shown in FIG. 4A, the sub-substrate 10-2 (if not removed), the semiconductor layer 30, and the epitaxial layer 40 are removed from the side of the stacked structure SS close to the sub-substrate 10-2 (or the semiconductor layer 30) to form through holes H1. In other words, the through hole H1 penetrates the sub-substrate 10-2, the semiconductor layer 30, and the epitaxial layer 40. Moreover, in some embodiments, during the patterning of the sub-substrate 10-2, the semiconductor layer 30, and the epitaxial layer 40, a portion of the device layer 50 is also patterned. In other words, the through hole H1 further penetrates a portion of the device layer 50.

The foregoing process may be regarded as a patterning process. For example, a mask layer (not shown) may be provided on the stacked structure SS (e.g., on the sub-substrate 10-2 or the semiconductor layer 30), and then the mask layer is used as an etching mask to perform an etching process to pattern the sub-substrate 10-2, the semiconductor layer 30, and the epitaxial layer 40. The mask layer may include a hard mask and may include silicon oxide ($SiO_2$), silicon nitride (SiN), silicon oxynitride (SiON), silicon carbide (SiC), silicon carbonitride (SiCN), any other similar material, or a combination thereof. The mask layer may be a single-layer structure or a multi-layer structure. The mask layer may be formed by a deposition process, a photolithography process, any other suitable process, or a combination thereof. For example, the deposition process includes spin-on coating, chemical vapor deposition (CVD), atomic layer deposition (ALD), any other similar process, or a combination thereof. For example, the photolithography process may include photoresist coating (e.g., spin coating), soft baking, mask aligning, exposure, post-exposure baking (PEB), developing, rinsing, drying (e.g., hard baking), any other suitable process, or a combination thereof.

Then, as shown in FIG. 4A, in some embodiments, an interconnector structure 70 is formed to cover the through hole H1, and the interconnector structure 70 is electrically connected to the epitaxial layer 40 and/or the device layer 50. In other words, the interconnector structure 70 may be formed in the through hole H1. The interconnector structure 70 may be used as a source contact or a drain contact of the device layer 50. For example, the interconnector structure 70 includes conductive materials, such as a metal, a metal silicide, any other similar material, or a combination thereof. The metal may include copper (Cu), gold (Au), nickel (Ni), platinum (Pt), palladium (Pd), iridium (Ir), titanium (Ti), chromium (Cr), tungsten (W), aluminum (Al), any other similar material, an alloy thereof, or a combination thereof. Moreover, the interconnector structure 70 may be formed in the through hole H1 by physical vapor deposition (PVD), chemical vapor deposition (CVD), atomic layer deposition (ALD), evaporation, sputtering, any other similar process, or a combination thereof.

As shown in FIG. 4A, in some embodiments, the interconnector structure 70 is electrically connected to the device layer 50 through the through hole H1. In some embodiments, the interconnector structure 70 is in direct contact with the device layer 50. Moreover, as shown in FIG. 4A, the interconnector structure 70 extends from the through hole H1 to the sub-substrate 10-2 (or the semiconductor layer 30). That is, a portion of the interconnector structure 70 is disposed on the sub-substrate 10-2 (or the semiconductor layer 30).

Then, as shown in FIG. 4A, in some embodiments, a conductive protection layer 72 and an insulating layer 74 may be optionally formed on the interconnector structure 70, the insulating layer 74 covers a portion of the interconnector structure 70, and the conductive protection layer 72 is disposed on the interconnector structure 70 that is not covered by the insulating layer 74. In other words, the insulating layer 74 may expose the conductive protection layer 72. For example, the conductive protection layer 72 may include nickel (Ni), gold (Au), or any other suitable conductive material to protect the interconnector structure 70. Moreover, the conductive protection layer 72 may be formed on the interconnector structure 70 by physical vapor deposition, chemical vapor deposition, atomic layer deposition, evaporation, sputtering, any other similar process, or a combination thereof. For example, the insulating layer 74 may include polyimide (PI) or any other suitable material. In addition, the insulating layer 74 may be formed on the interconnector structure 70 by a deposition process and a patterning process. Examples of the deposition process and the patterning process are described above, and will not be repeated here. As shown in FIG. 4A, a portion of the insulating layer 74 is also disposed on the sub-substrate 10-2 (or the semiconductor layer 30).

The stage of manufacturing the semiconductor structure 100 shown in FIG. 4A may be regarded as a process step of forming backside through silicon vias (TSV) and metal (e.g., copper (Cu)) redistribution layers (RDL). In other words, through the aforementioned method of the present disclosure, the backside through silicon vias (TSV) and the metal redistribution layers (RDL) may be easily formed. Compared with the wire-bonding method, the backside through silicon vias (TSV) may reduce the parasitic capacitance of the semiconductor structure 100.

Figure 4B:
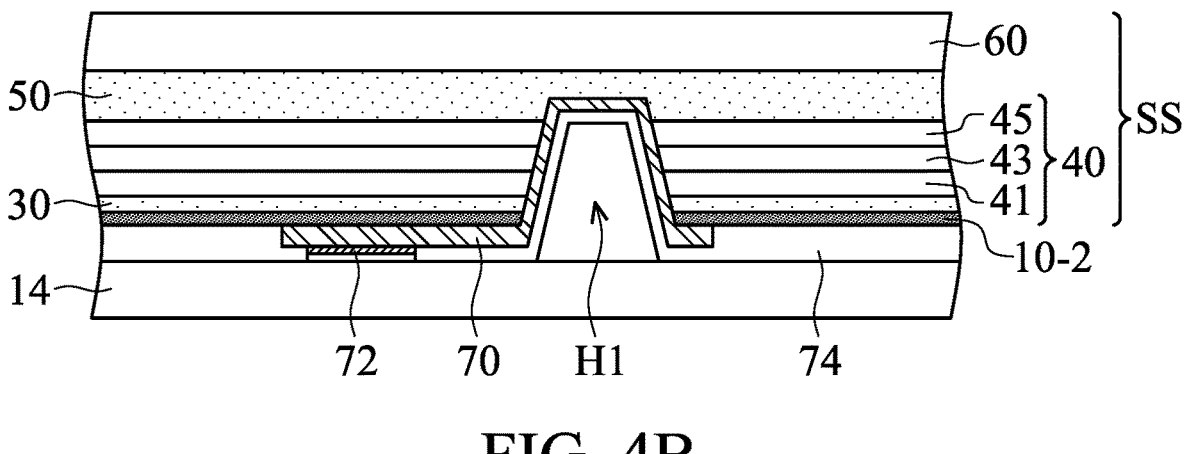

Referring to FIG. 4B, in some embodiments, the stacked structure SS and the interconnector structure 70 (that optionally includes the conductive protection layer 72 and the insulating layer 74) are transferred from the carrier substrate 12 to a dicing frame 14, so that the interconnector structure 70 is between the dicing frame 14 and the device layer 50. Specifically, the stacked structure SS and the interconnector structure 70 are placed upside down on the dicing frame 14, so that the semiconductor layer 30 (or the sub-substrate 10-2) is between the dicing frame 14 and the epitaxial layer 40. In other words, the insulating layer 74 may be adhered to the dicing frame 14.

Figure 4C:
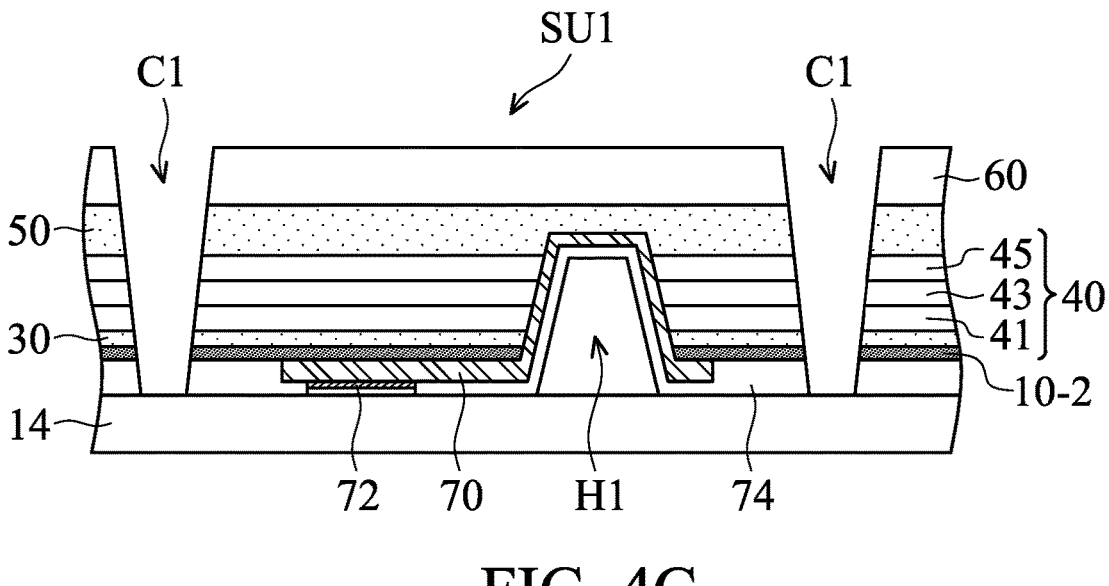

Referring to FIG. 4C, in some embodiments, the stacked structure SS is diced into at least one semiconductor unit SU1 on the dicing frame 14, and the semiconductor unit SU1 includes at least one interconnector structure 70. For example, multiple dicing grooves C1 may be formed in the stacked structure SS through a laser grooving process and/or a blade saw to form a plurality of separate semiconductor units SU1, but the present disclosure is not limited thereto. In some other examples, it is also possible to directly perform a laser grooving process on the stacked structure SS without using a blade saw to form a plurality of separate semiconductor units SU1.

Figure 4D:
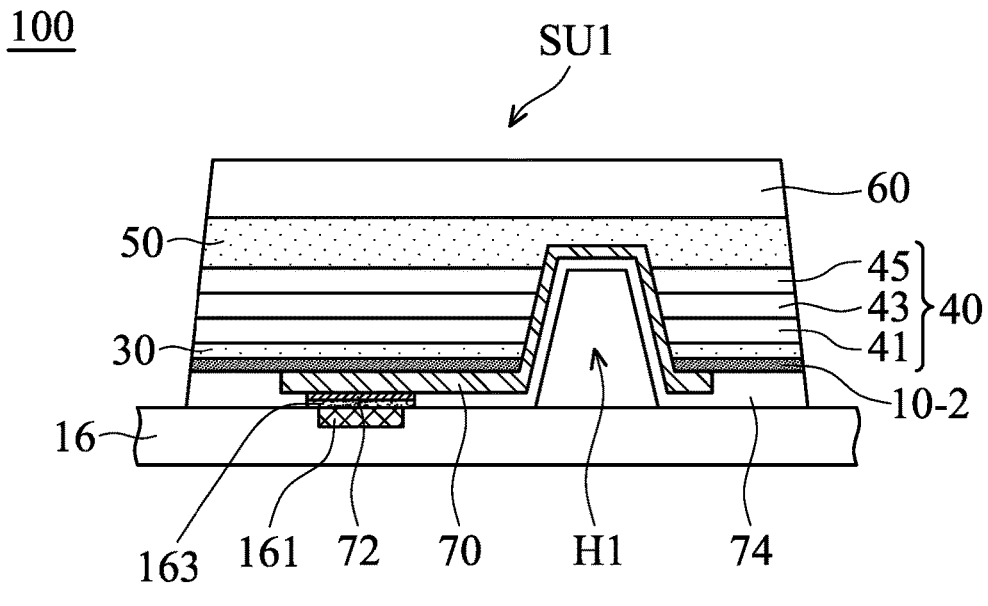

Referring to FIG. 4D, in some embodiments, at least one semiconductor unit SU1 is transferred from the dicing frame 14 to a lead frame 16 and bonded to the lead frame 16 to form the semiconductor structure 100. In some embodiments, the lead frame 16 may be a packaging metal frame used for packaging the semiconductor unit SU1, which may include copper (Cu), nickel-iron (NiFe), lead (Pb), tin (Sn), gold (Au), nickel (Ni), platinum (Pt), palladium (Pd), iridium (Ir), titanium (Ti), chromium (Cr), tungsten (W), aluminum (Al), stainless steel frame, any other suitable material, or a combination thereof.

As shown in FIG. 4D, in some embodiments, a portion of the interconnector structure 70 is disposed between the lead frame 16 and the sub-substrate 10-2 (or the semiconductor layer 30). Specifically, since the interconnector structure 70 may extend from the through hole H1 (see FIG. 4A) to the surface of the sub-substrate 10-2 (or the semiconductor layer 30), when the separate semiconductor units SU1 are transferred from the dicing frame 14 to the lead frame 16 and bonded to the lead frame 16, a portion of the interconnector structure 70 may be between the lead frame 16 and the sub-substrate 10-2 (or the semiconductor layer 30).

Moreover, the lead frame 16 may include a conductive pad 161. For example, as shown in FIG. 4D, the interconnector structure 70 (or the conductive protection layer 72) may be connected to the conductive pad 161 of the lead frame 16 through the conductive member 163, so that the semiconductor unit SU1 may be electrically connected to the lead frame 16, but the present disclosure is not limited thereto.

Referring to FIG. 4D, in some embodiments, the semiconductor structure 100 includes a lead frame 16 and a sub-substrate 10-2 disposed on the lead frame 16. The semiconductor structure 100 also includes an epitaxial layer 40 disposed on the sub-substrate 10-2. The epitaxial layer 40 includes a buffer layer 41, a channel layer 43, and a barrier layer 45, the buffer layer 41 is disposed between the sub-substrate 10-2 and the channel layer 43, and the channel layer 43 is disposed between the buffer layer 41 and the barrier layer 45. The semiconductor structure 100 further includes a device layer 50 and an interconnector structure 70, the device layer 50 is disposed on the barrier layer 45, and the interconnector structure 70 electrically connected to the epitaxial layer 40 and/or the device layer 50 by a through hole H1.

As the cross-sectional views at different stages of manufacturing the semiconductor structure 100 of the embodiment shown in FIG. 1 to FIG. 3 and FIG. 4A to FIG. 4D, through the manufacturing method of the semiconductor structure 100 according to the embodiment of the present disclosure, most of the substrate 10 (e.g., the main substrate 10-1 in FIG. 3) may be recycled and reused, so as to reduce the overall manufacturing cost. Moreover, it may also reduce the difficulty and cost of dicing or backside grinding (BG), and allow the formation, for example, through silicon vias (TSV) or redistribution layers (RDL), which is a difficult process with a thick substrate.

Figure 5A:
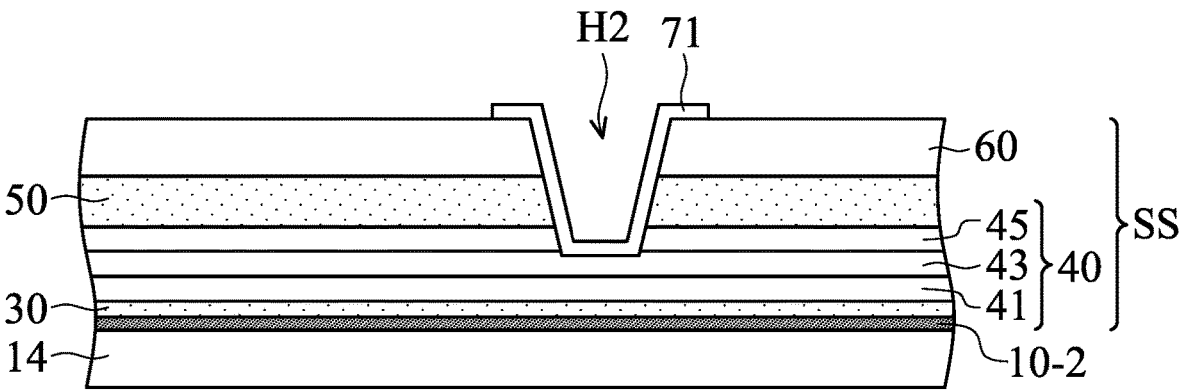
FIG. 5A to FIG. 5C are cross-sectional views illustrating different stages of manufacturing the semiconductor structure according to some other embodiments of the present disclosure.
Figure 5B:
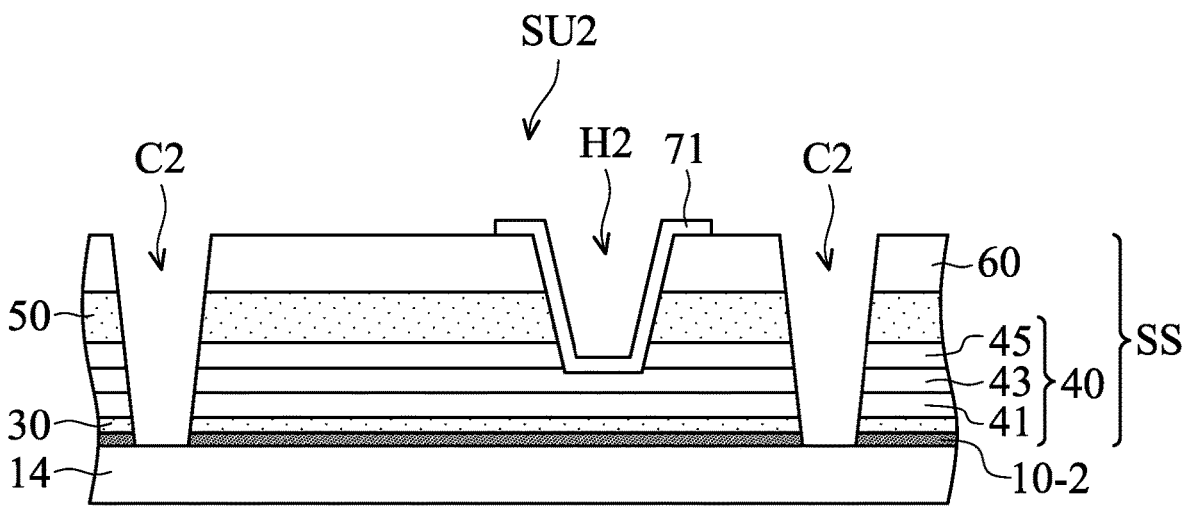
Figure 5C:
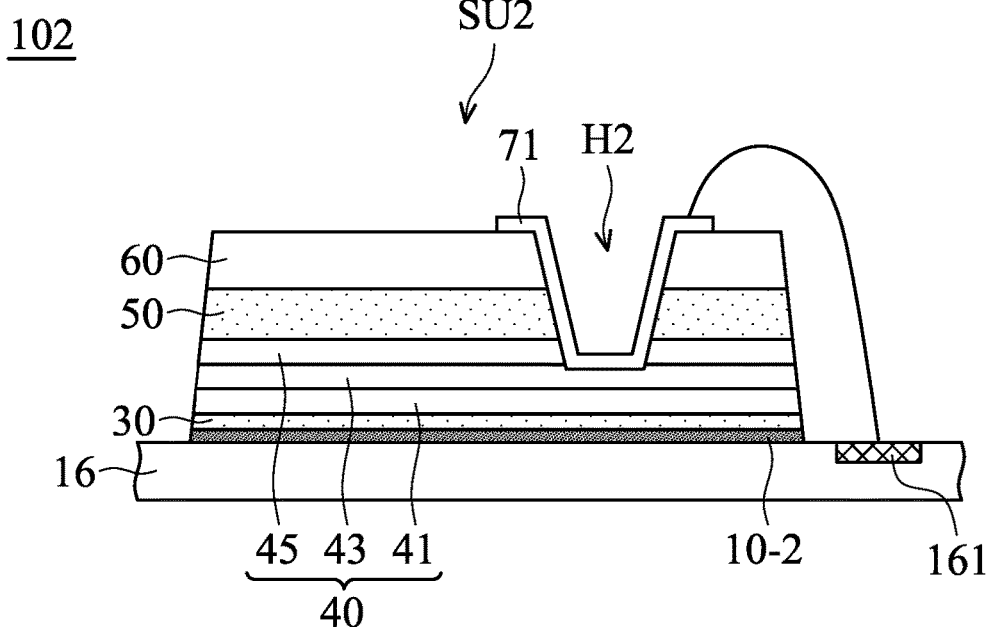

FIG. 5A to FIG. 5C are cross-sectional views illustrating different stages of manufacturing the semiconductor structure 102 according to some other embodiments of the present disclosure. The stage shown in FIG. 5A may be, for example, subsequent to the stage shown in FIG. 3 (e.g., the main substrate 10-1 of the substrate 10 is removed, and the sub-substrate 10-2 is left). Similarly, some components of the semiconductor structure 102 have been omitted in FIG. 5A to FIG. 5C in order to show the technical features of the embodiments of the present disclosure more clearly.

Referring to FIG. 5A, in some embodiments, the stacked structure SS is transferred from the carrier substrate 12 to a dicing frame 14, so that the epitaxial layer 40 is between the dicing frame 14 and the device layer 50. Specifically, the stacked structure SS is placed upside down on the dicing frame 14, so that the sub-substrate 10-2 (or the semiconductor layer 30) is between the dicing frame 14 and the epitaxial layer 40.

Then, referring to FIG. 5A, in some embodiments, at least a portion of the device layer 50 and the epitaxial layer 40 are patterned from the side away from the sub-substrate 10-2 to form multiple through holes H2 in the stacked structure SS (only one through hole H2 is shown in FIG. 5A). Specifically, the device layer 50 (and the passivation layer 60) is patterned from the side of the stacked structure SS close to the device layer 50 (or the passivation layer 60) to form the through hole H2. In other words, the through hole H2 penetrates (the passivation layer 60 and) the device layer 50. Moreover, in some embodiments, during the patterning of the device layer 50, a portion of the epitaxial layer 40 is also patterned. In other words, the through hole H2 further penetrates a portion of the epitaxial layer 40.

The foregoing process may be regarded as a patterning process. Examples of the patterning process are described above and will not be repeated here. Then, as shown in FIG. 5A, in some embodiments, an interconnector structure 71 is formed in the through hole H2. The interconnector structure 71 may be used as a source contact or a drain contact of the device layer 50. For example, the material and manufacturing method of the interconnector structure 71 shown in FIG. 5A are the same as or similar to those of the interconnector structure 70 shown in FIG. 4A, and will not be repeated here. As shown in FIG. 5A, in some embodiments, the interconnector structure 71 is electrically connected to the epitaxial layer 40 through the through hole H2. In some embodiments, the interconnector structure 71 is in direct contact with the epitaxial layer 40 (e.g., the channel layer 43 and the barrier layer 45). Moreover, as shown in FIG. 5A, the interconnector structure 71 extends from the through hole H2 to the passivation layer 60 (or the element layer 50). That is, a portion of the interconnector structure 71 is disposed on the top surface of the passivation layer 60 (or the device layer 50).

Similarly, it is also possible to form a conductive protection layer 72 and an insulating layer 74 similar to those shown in FIG. 4A on the interconnector structure 71 shown in FIG. 5A, the insulating layer 74 covers a portion of the interconnector structure 71, and the conductive protection layer 72 is disposed on the interconnector structure 71 that is not covered by the insulating layer 74, but the present disclosure is not limited thereto.

Referring to FIG. 5B, in some embodiments, the stacked structure SS is diced into at least one semiconductor unit SU2 on the dicing frame 14, and the semiconductor unit SU2 includes at least one interconnector structure 71. Similarly, multiple dicing grooves C2 may be formed in the stacked structure SS through a laser grooving process and/or a blade saw to form a plurality of separate semiconductor units SU2, but the present disclosure is not limited thereto. In some other examples, it is also possible to directly perform a laser grooving process on the stacked structure SS without using a blade saw to form a plurality of separate semiconductor units SU2.

Referring to FIG. 5C, in some embodiments, at least one semiconductor unit SU2 is transferred from the dicing frame 14 to a lead frame 16 and bonded to the lead frame 16 to form the semiconductor structure 102. Specifically, the lead frame 16 may include a conductive pad 161. For example, as shown in FIG. 5C, the interconnector structure 71 may be connected to the conductive pad 161 of the lead frame 16 through wire-bonding, so that the semiconductor unit SU2 may be electrically connected to the lead frame 16, but the present disclosure is not limited thereto.

In summary, through the manufacturing method of the semiconductor structure according to the embodiment of the present disclosure, the substrate may be recycled and reused, so as to reduce the overall manufacturing cost. Moreover, it may also reduce the difficulty and cost of dicing or backside grinding (BG), and allow the formation of, for example, through silicon vias (TSV) or redistribution layers (RDL).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor structure, comprising:
a lead frame;
a sub-substrate disposed on the lead frame, wherein a thickness of the sub-substrate is between 0 and 0.5 μm;
an epitaxial layer disposed on the sub-substrate, wherein the sub-substrate has a first outer surface that is opposite to the epitaxial layer, and the epitaxial layer comprises a buffer layer, a channel layer and a barrier layer, the buffer layer is disposed between the sub-substrate and the channel layer, and the channel layer is disposed between the buffer layer and the barrier layer;
a device layer disposed on the barrier layer;
a passivation layer disposed on the device layer, wherein the passivation layer has a second outer surface that is opposite to the device layer; and
an interconnector structure disposed in a through hole that penetrates the device layer and a portion of the epitaxial layer or a through hole that penetrates the sub-substrate and the epitaxial layer, wherein the through hole penetrates only one of the first outer surface and the second outer surface, and the interconnector structure is electrically connected to the epitaxial layer or the device layer.

2. The semiconductor structure as claimed in claim 1, wherein the interconnector structure is in direct contact with the device layer.

3. The semiconductor structure as claimed in claim 1, wherein a portion of the interconnector structure is disposed between the lead frame and the sub-substrate.

4. The semiconductor structure as claimed in claim 1, wherein the through hole penetrates the passivation layer.

5. The semiconductor structure as claimed in claim 4, further comprising:
a semiconductor layer disposed between the sub-substrate and the buffer layer.

6. The semiconductor structure as claimed in claim 4, wherein the through hole further penetrates a portion of the epitaxial layer.

7. The semiconductor structure as claimed in claim 1, further comprising:
a semiconductor layer disposed between the sub-substrate and the buffer layer.

8. The semiconductor structure as claimed in claim 7, wherein the interconnector structure is electrically connected to the semiconductor layer.

9. The semiconductor structure as claimed in claim 1, wherein the through hole further penetrates a portion of the epitaxial layer.

10. The semiconductor structure as claimed in claim 1, further comprising:

an insulating layer covering a portion of the interconnector structure.

11. The semiconductor structure as claimed in claim 10, further comprising:

a conductive protection layer cover disposed on the interconnector structure that is not covered by the insulating layer.

12. The semiconductor structure as claimed in claim 1, wherein the device layer comprises a source structure, a drain structure, and a gate structure.

13. The semiconductor structure as claimed in claim 1, wherein the sub-substrate is composed of a dielectric layer.

14. A manufacturing method of a semiconductor structure, comprising:

providing a sub-substrate having a thickness between 0 and 0.5 μm;

forming an epitaxial layer on the sub-substrate, wherein the sub-substrate has a first outer surface that is opposite to the epitaxial layer, and the epitaxial layer comprises a buffer layer, a channel layer and a barrier layer, the buffer layer is disposed between the sub-substrate and the channel layer, and the channel layer is disposed between the buffer layer and the barrier layer;

forming a device layer on the barrier layer to form a stacked structure;

forming a passivation layer on the device layer, wherein the passivation layer has a second outer surface that is opposite to the device layer;

providing a carrier substrate, wherein the device layer is between the carrier substrate and the sub-substrate;

removing at least a portion of the sub-substrate;

forming at least one through hole in the stacked structure, wherein the through hole penetrates the device layer and a portion of the epitaxial layer or penetrates the sub-substrate and the epitaxial layer, and the through hole penetrates only one of the first outer surface and the second outer surface;

forming at least one interconnector structure disposed in and covering the through hole, wherein the interconnector structure is electrically connected to the epitaxial layer or the device layer; and transferring the stacked structure and the interconnector structure from the carrier substrate to a lead frame, such that the sub-substrate is disposed on the lead frame.

15. The manufacturing method of the semiconductor structure as claimed in claim 14, wherein the through hole patterns at least a portion of the epitaxial layer from a side adjacent to the sub-substrate.

16. The manufacturing method of the semiconductor structure as claimed in claim 15, wherein before transferring the stacked structure and the interconnector structure from the carrier substrate to the lead frame, the manufacturing method of the semiconductor structure further comprises:

transferring the stacked structure and the interconnector structure from the carrier substrate to a dicing frame, wherein the interconnector structure is between the dicing frame and the device layer; and dicing the stacked structure into at least one semiconductor unit on the dicing frame, wherein the semiconductor unit comprises the interconnector structure.

17. The manufacturing method of the semiconductor structure as claimed in claim 14, wherein before forming the through hole in the stacked structure, the manufacturing method of the semiconductor structure further comprises:

transferring the stacked structure from the carrier substrate to a dicing frame, wherein the epitaxial layer is between the dicing frame and the device layer; and patterning at least a portion of the device layer and the epitaxial layer from a side away from the sub-substrate to form the through hole.

18. The manufacturing method of the semiconductor structure as claimed in claim 17, further comprising:

dicing the stacked structure into at least one semiconductor unit on the dicing frame, wherein the semiconductor unit comprises the interconnector structure.

* * * * *